United States Patent
Zubkow et al.

(10) Patent No.: US 10,797,701 B2
(45) Date of Patent: Oct. 6, 2020

(54) COMPENSATING FOR DEGRADATION OF ELECTRONICS DUE TO RADIATION VULNERABLE COMPONENTS

(71) Applicant: Honeywell International Inc., Morris Plains, NJ (US)

(72) Inventors: Zygmunt Zubkow, Dunedin, FL (US); Richard Wessels, Dunedin, FL (US); John Lintz, Glendale, AZ (US)

(73) Assignee: Honeywell International Inc., Morris Plains, NJ (US)

( * ) Notice: Subject to any disclaimer, the term of this patent is extended or adjusted under 35 U.S.C. 154(b) by 261 days.

(21) Appl. No.: 15/861,528

(22) Filed: Jan. 3, 2018

(65) Prior Publication Data
US 2019/0207606 A1    Jul. 4, 2019

(51) Int. Cl.
| | |
|---|---|
| *G06F 11/14* | (2006.01) |
| *H03K 19/003* | (2006.01) |
| *G01T 1/02* | (2006.01) |
| *H01L 31/119* | (2006.01) |

(52) U.S. Cl.
CPC ......... *H03K 19/0033* (2013.01); *G01T 1/026* (2013.01); *G06F 11/14* (2013.01); *H03K 19/00338* (2013.01); *H01L 31/119* (2013.01)

(58) Field of Classification Search
CPC .... H03K 19/0033; G01T 1/026; H01L 31/119
See application file for complete search history.

(56) References Cited

U.S. PATENT DOCUMENTS

| | | | |
|---|---|---|---|
| 3,743,955 | A | 7/1973 | Stehlin |
| 3,891,843 | A | 6/1975 | Parkin |
| 6,794,908 | B2 | 9/2004 | Erstad |
| 7,036,059 | B1 | 4/2006 | Carmichael et al. |

(Continued)

FOREIGN PATENT DOCUMENTS

| | | |
|---|---|---|
| CN | 101615211 A | 12/2009 |
| EP | 3144936 A1 | 3/2017 |
| WO | 2007030120 A1 | 3/2017 |

OTHER PUBLICATIONS

Sharma, "Chapter 7: Semiconductor Memory Radiation Effects," 1997, pp. 320-386.

(Continued)

*Primary Examiner* — William Hernandez
(74) *Attorney, Agent, or Firm* — Shumaker & Sieffert, P.A.

(57) ABSTRACT

Techniques to compensate non-radiation hardened components for changes or degradation in performance that result from exposure to radiation. During testing and modeling phase, a component's performance may be characterized as a result of the exposure to radiation. In some examples, some performance characteristics, such as voltage response, frequency response, gain, leakage or other characteristics, may change as the component's exposure to an amount of radiation increases. During normal operation, a system may include one or more devices that measure the amount of radiation to which the system may be subjected, such as a radiation dosimeter. The system may compensate the non-radiation hardened component based on the amount of radiation received the known component performance change caused by radiation as determined during the modeling phase.

20 Claims, 7 Drawing Sheets

(56) References Cited

U.S. PATENT DOCUMENTS

| | | |
|---|---|---|
| 7,288,752 B2 | 10/2007 | Keshavarzi et al. |
| 7,443,191 B2 | 10/2008 | Plants |
| 7,482,565 B2 * | 1/2009 | Morgan .................... G01J 1/32 250/205 |
| 7,804,354 B2 | 9/2010 | Erstad |
| 8,384,016 B2 | 2/2013 | Ramsden |
| 9,280,184 B2 * | 3/2016 | Broga ................... G06F 1/1684 |
| 9,294,092 B2 | 3/2016 | Hutton |
| 2006/0000981 A1 | 1/2006 | Hannah |
| 2010/0026338 A1 | 2/2010 | Fulcomer |
| 2010/0156315 A1 | 6/2010 | Zhao et al. |
| 2012/0065919 A1 | 3/2012 | Brown et al. |
| 2013/0240744 A1 | 9/2013 | Hurst, Jr. et al. |
| 2014/0138555 A1 | 5/2014 | Hannah |
| 2015/0334792 A1 | 11/2015 | Jung |

OTHER PUBLICATIONS

Debar, "Dynamic substrate bias to achieve radiation hardening," IBM Corp., Apr. 1983, 2 pp.

U.S. Appl. No. 15/861,560, by Zygmunt Zubkow et al., filed Jan. 3, 2018.

Extended Search Report from counterpart European Application No. 19150120.4, dated May 22, 2019, 10 pp.

Response to Extended Search Report dated May 22, 2019, from counterpart European Application No. 19150120.4, filed Nov. 27, 2019, 16 pp.

* cited by examiner

US 10,797,701 B2

COMPENSATING FOR DEGRADATION OF ELECTRONICS DUE TO RADIATION VULNERABLE COMPONENTS

TECHNICAL FIELD

The disclosure relates to circuits exposed to radiation.

BACKGROUND

Degradation of performance or operation of electronic systems occurs in radiation environments due to component radiation vulnerability. In many cases, components are still operational, but their performance characteristics will change as a result of radiation exposure. Current methods include using radiation hardened components. Radiation hardened components are not available for some component types and also tend to have long lead times and be significantly more expensive.

SUMMARY

In general, the disclosure is directed to techniques to compensate non-radiation hardened components for changes or degradation in performance that result from exposure to radiation. A component may be exposed to a predetermined amount of radiation over a predetermined time period. The component's performance characteristics, such as voltage response, frequency response, gain, leakage or other characteristics, may be measured before, during, and/or after the exposure to radiation. A component's performance may be modeled as a result of the exposure to radiation. In some examples, some performance characteristics may change as the component's exposure to an amount of radiation increases. During normal operation, a system may include one or more devices, such as a radiation dosimeter, that measure the amount of radiation to which the system may be subjected. The system may compensate the non-radiation hardened component based on the amount of radiation received and the known component performance change caused by radiation based on the modeling.

In one example, the disclosure is directed to a method comprising: receiving, by a processing circuit, a signal indicating an amount of radiation received at a radiation sensor, determining, by the processing circuit, an amount of radiation received over a time period at the radiation sensor, determining, by the processing circuit, a compensation factor for a circuit component based on the amount of radiation received over the time period at the radiation sensor, and compensating, by the processing circuit, an output signal of the circuit component, based on the compensation factor.

In another example, the disclosure is directed to a circuit comprising: a processing circuit, a radiation sensor, wherein the processing circuit is configured to receive a signal indicating an amount of radiation received over a time period at a radiation sensor, a circuit component, wherein the processing circuit is configured to: determine an amount of radiation received over a time period, based on the signal from the radiation sensor, determine a compensation factor for the circuit component, based on the amount of radiation received over the time period at the radiation sensor, and compensate an output of the circuit component, based on the compensation factor.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
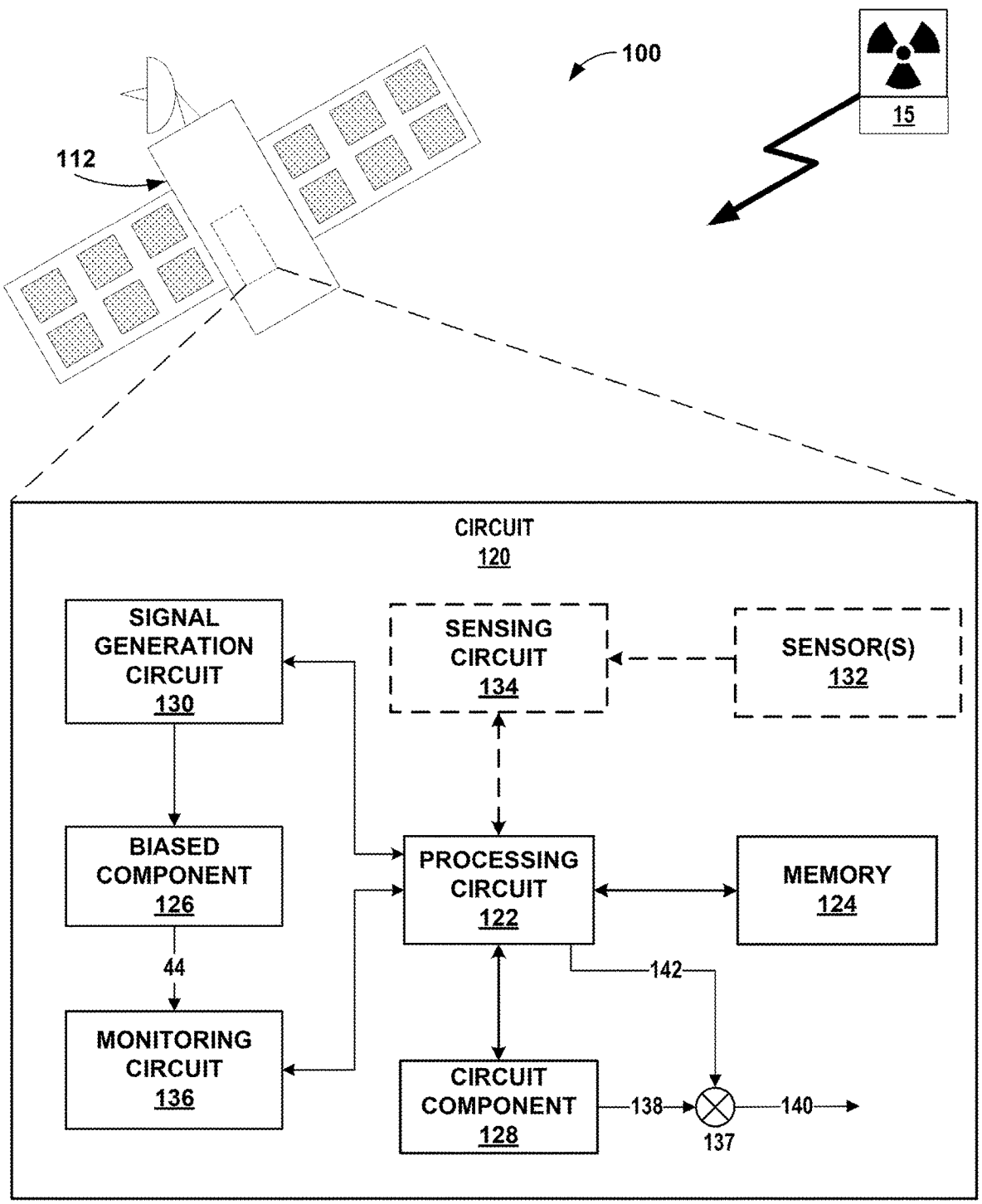
FIG. 1 is a block diagram illustrating an example system configured to compensate a non-radiation hardened component based on biasing a representative component, according to one or more techniques of this disclosure.

In general, the disclosure is directed to techniques to compensate non-radiation hardened components for changes or degradation in performance that result from exposure to radiation. There are several techniques to determine the needed compensation.

In some examples, a sample of components to be used in a system may be exposed to a known amount of radiation over a predetermined time period during a testing or modeling phase. Testing and modeling may include time-dependent effects associated with total dose radiation exposure, both dose rate (flux) and time-dependent effects (TDE) mechanisms, such as annealing, and correlated with temperature dependencies. The component's performance characteristics, such as voltage response, frequency response, gain, leakage or other characteristics, may be measured at various exposure levels to the radiation to model a component's performance as a function of the exposure to radiation. In some examples, some performance characteristics may change as the component's exposure to an amount of radiation increases. During normal operation, a system may include one or more devices, such as a radiation dosimeter, that measure the amount of radiation to which the system has been subjected. The system may compensate the non-radiation hardened component based on the amount of radiation received and the known component performance change caused by radiation as determined during the modeling of the sample components.

In one example, a system may include a metal oxide semiconductor field effect transistor (MOSFET) dosimeter for measuring the radiation. The change in performance as a result of radiation exposure to the vulnerable, non-radiation hardened component part may be characterized and available to the system. In some examples, the radiation characterization may be saved in system memory as a lookup table, or as one or more linear or non-linear formulae. The system may determine a compensation factor that may restore the desired signal output from the component. The system may apply the compensation via summing amps, digital to analog electronics, or other methods. Other examples of compensation may include using additional parts to correct the output of the sensitive part or by re-interpreting the output to compensate for the radiation response of the part as characterized.

In another example, to determine compensation, a system may be configured to apply a known or constant bias signal to a non-radiation hardened component while the system is in use. The system determines whether there is a performance change in characteristics of the component by monitoring an output of the component while the component is subject to the bias signal. Some examples of component performance characteristics, may include voltage response, frequency response, gain, leakage or other characteristics. The system may determine a compensation factor that may restore an output of the component to an original value. The system may compensate a second component that is in use in the system using the compensation factor determined for the component subject to the bias signal. Thus, the component receiving the known bias signal may essentially act as a characterization dosimeter of the component in use in the system.

The system may include multiple vulnerable, non-radiation hardened component types placed throughout a system supplied with predetermined bias signals. The outputs of the biased components may be fed to an analog switch that may further send the received signals to an analog to digital (A/D) converter or other monitoring circuit. In this manner, a large number of radiation vulnerable components may be characterized simultaneously with representative parts, that is components behave the same when exposed to radiation. The system may compensate components in use in the system with the appropriate compensation factor for each.

The techniques of this disclosure may allow some components that have known radiation vulnerability to be used in applications that currently require radiation hardened components. Radiation hardened systems, comprised completely of radiation hardened components, typically cost a great deal more than systems without radiation hardened components. In some examples, completely unique designs need to be created to only use available radiation hardened components and may be limited by non-availability of a radiation hardened version of a desired component. The limited selection may mean some designs may not be able to take advantage of components that do not have a radiation hardened version. This may result in limiting a design to slower, less capable components, or in reducing features that may be useful because a component is not available as radiation hardened. Other limitations may include size and weight. Limiting a design to radiation hardened components may result in not taking advantage of smaller components with the same or better performance characteristics. The techniques of this disclosure may allow components with lower radiation tolerance to be used without the resulting longer lead time and greater expense. The techniques of this disclosure may open numerous opportunities for creation of much less expensive systems, or in some cases, new systems that currently cannot be designed or created at all because of radiation environments.

FIG. 1 is a block diagram illustrating an example system configured to compensate a non-radiation hardened component based on biasing a representative component, according to one or more techniques of this disclosure. The example of system 100 is shown as an aerospace application, but the techniques may be applied to any potential environment subject to radiation exposure, such as medical, power plants and similar environments.

FIG. 1 includes a spacecraft 112 that includes a circuit 120 and may be subject to radiation exposure 15. Radiation exposure 15 may include any type of radiation including alpha, beta, gamma, X-ray and the like.

Circuit 120 may perform any number of possible functions. In the example of spacecraft 112, circuit 120 may perform communications, data gathering, navigation, power conversion or any other function performed by a circuit. The example of circuit 120 includes processing circuit 122 connected to memory 124, as well as signal generation circuit 130, monitoring circuit 136 and circuit component 128. Signal generation circuit 130 may output one or more bias signals to biased component 126. In some examples circuit 120 may include sensing circuit 34 that may receive signals from one or more sensors 132.

The techniques of this disclosure may be advantageous to compensate analog components and analog signals, though the techniques may also be applied to digital or combination analog/digital circuits. For simplicity, the description will focus on compensating analog components, therefore, unless otherwise noted, circuit component 128 and biased component 126 may be assumed to be analog components, such as an amplifier, which may include one or more subcomponents, such as transistors, resistors, capacitors and other similar subcomponents.

Processing circuit 122 may perform one or more functions for circuit 120. For example, processing circuit 122 may be configured to receive an output signal 44 from biased component 126 via monitoring circuit 136. In some examples, monitoring circuit 136 may be included within processing circuit 122. Processing circuit 122 may determine whether there is a performance change over time in biased component 126, based on output signal 44. In response to determining that there is performance change in biased component 126, processing circuit 122 may determine a compensation factor, such that the compensation factor is configured to restore the desired signal output from biased component 126. In other words, the compensation factor, when applied to output signal 44, may correct output signal 44 to a desired or original signal that biased component 126 may have output before the performance of biased component 126 changed. The compensation factor may compensate output 44 of the biased component 126 based on the performance change. In some examples, the compensation factor be a scaling factor, an offset factor or some combination of both. The compensation factor may impact any one of the performance characteristics of biased component 126, such as voltage response, frequency response, gain, leakage and other characteristics. In the example of an amplifier, the impact on voltage response may include dampening overshoot, restoring the response speed, and increasing or decreasing the amplification as need. In the example of a filter, the compensation factor may impact the 3 dB point in the frequency response by adjusting the 3 dB point up or down to restore the frequency response to an original, pre-irradiated performance. Other examples of biased components may be, but are not limited to, ring laser gyros, accelerometers, integrated circuits, operational amplifiers, Zener diodes, analog to digital converters, and voltage references.

Processing circuit 122 may be implemented as any one or more of a microprocessor, a controller, a digital signal processor (DSP), an application specific integrated circuit (ASIC), a field-programmable gate array (FPGA), a system on chip (SoC) or equivalent discrete or integrated logic circuitry. A processor may be integrated circuitry, i.e., integrated processing circuitry, and the integrated processing circuitry may be realized as fixed hardware processing circuitry, programmable processing circuitry and/or a combination of both fixed and programmable processing circuitry.

Signal generation circuit 130 may output a predetermined biasing signal to biased component 126. Some examples of a bias signal may include a DC voltage, a DC current, or some time varying signal, such as a sinusoid, square wave, impulse signal or other types of signals. A DC voltage is a voltage that is substantially constant over a time period. A DC current is a substantially constant current. In this disclosure, substantially constant means the signal is constant within measurement and manufacturing tolerances. In some examples, the biasing signal may not necessarily be constant, but may be otherwise known, such that monitoring circuit 136 can compare an actual output of biased component 126 to an expected output of biased component 126 based on the known biasing signal. Based on the comparison of the actual output of biased component 126 to the expected output of biased component 126, processing circuit 122 or monitoring circuit 136 can determine a compensation factor.

Monitoring circuit 136 may receive the output signal from biased component 126. Monitoring circuit 136 may include any one or more of amplifiers, filters, such as high pass, low pass, digital sampling, such as analog to digital converter (ADC), or other types of signal processing and may be radiation hardened. In some examples monitoring circuit 136 may include an analog switch, i.e. a multiplexor, that may receive output signals from a plurality of biased components throughout system 100. Monitoring circuit 136 may receive commands from processing circuit 122 and may send the processed output signal 44 to processing circuit 122.

Processing circuit 122 may communicate with memory 124. Memory 124 may store program instructions, which may include one or more program modules executable by processing circuit 122. When executed by processing circuit 122, such program instructions may cause circuit 120 to provide the functionality ascribed to herein. Memory 124 may include any non-transitory computer-readable medium such as volatile, non-volatile, magnetic, optical, or electrical media. A non-transitory computer-readable medium includes but is not limited to random access memory (RAM), read-only memory (ROM), non-volatile RAM (NVRAM), electrically-erasable programmable ROM (EEPROM), flash memory, or any other computer-readable media, with the sole exception being a transitory, propagating signal. Memory 124 may also be referred to as a data storage unit.

Circuit component 128, in the example of FIG. 1, is of the same type as biased component 126. In some examples, circuit component 128 is matched as closely as feasible to biased component 126. For example, both circuit component 128 and biased component 126 may come from the same manufacturing lot number, may be produced to the same specifications at the same manufacturing site, and may be handled and stored under the same conditions. Therefore, the impact of radiation on the performance characteristics of biased component 126, may be nearly the same as the impact of radiation on the performance characteristics of circuit component 128. Because biased component 126 and circuit component 128 both operate in the same environment, the radiation exposure 15 may be assumed to be the same for both biased component 126 and circuit component 128. Therefore scaling, or offsetting the output of circuit component 128 (138) by the compensation factor determined above for biased component 126 may restore the desired signal output signal 140 from circuit component 128 after a performance change caused by radiation.

In the example of FIG. 1, processing circuit 122 may output a signal 142 that includes a compensation factor. In some examples, signal 142 may be output from a digital-to-analog (D/A) circuit included with processing circuit 122. When combined with output signal 138 from circuit component 128 at junction 137, either by scaling, offset or some combination, the compensation factor, which is based on the output signal 44 from biased component 126, may correct desired output signal 140 for any performance change within circuit component 128 caused by radiation. As discussed above, the compensation factor may impact any of the performance characteristics of circuit component 128, such as voltage response, frequency response, gain, leakage and other performance characteristics.

Figure 2:
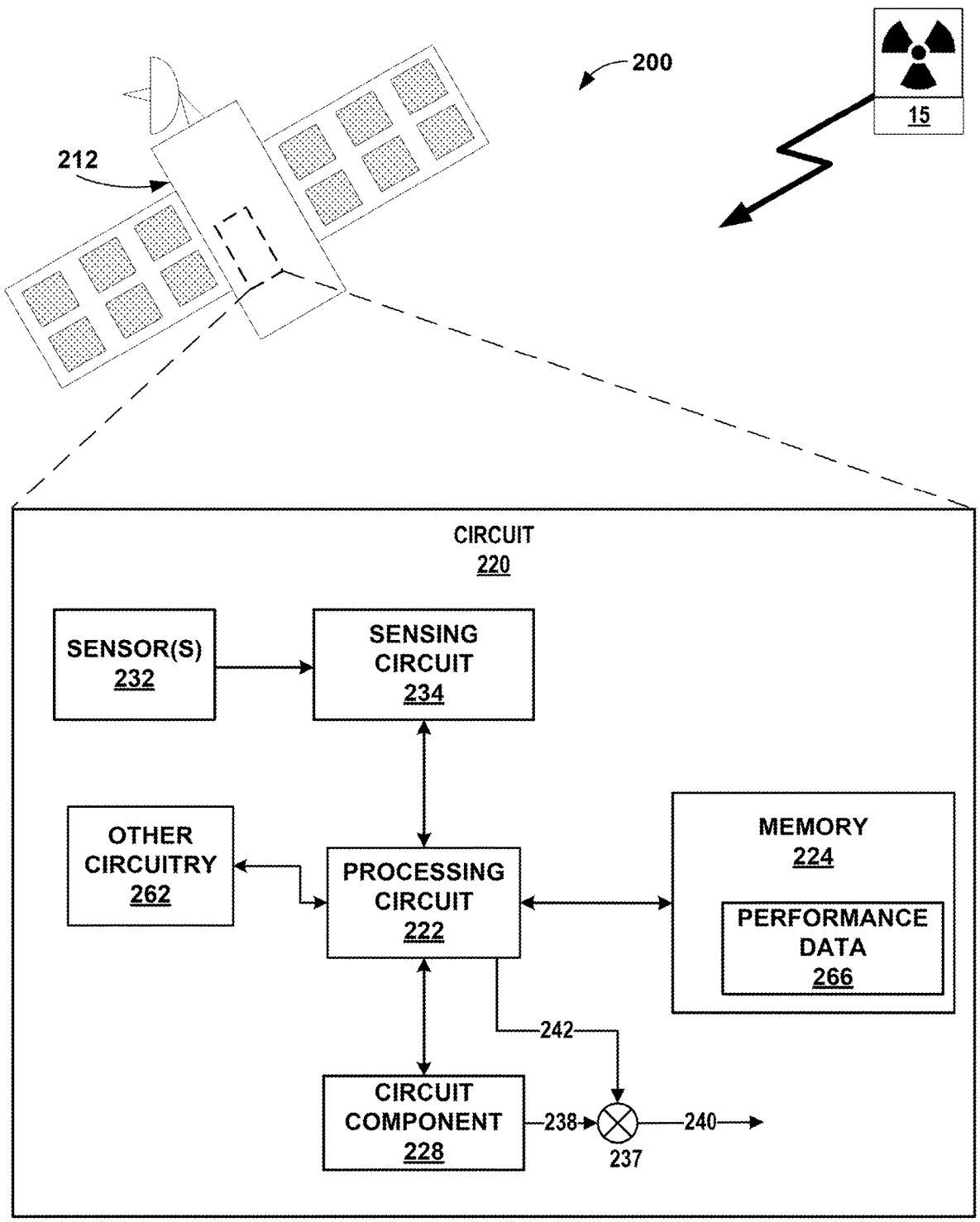
FIG. 2 is a block diagram illustrating an example system configured to compensate a non-radiation hardened component based on characterization of similar components, according to one or more techniques of this disclosure.

FIG. 2 is a block diagram illustrating an example system configured to compensate a non-radiation hardened component based on characterization of similar components, according to one or more techniques of this disclosure. Components in FIG. 2 that have reference numerals with the same final two digits as reference numerals in FIG. 1, can be assumed to the same function as the reference numerals in FIG. 1 with the same final two digits. For example, components 122 and 222 may be assumed to have the same function, components 124 and 224 may be assumed to have the same function, and so on. Example system 50 includes spacecraft 52 and circuit 60 that may be subject to radiation exposure 15. As with FIG. 1 above, though circuit 60 is shown in an aerospace example, the techniques may also be implemented in other applications including medical devices, power plants, or in any other applications that require radiation hardened components.

Circuit 60 includes processor circuit 222 that communicates with memory 224, as described above in relation to FIG. 1. Circuit 60 may also include sensing circuit 234 that receives signals from one or more sensors 232. Processing circuit 222 may receive signals from and may send signals to other circuitry 62 and circuit component 228.

Sensing circuit 234 may include filtering, amplification, sampling and other functions to receive and process signals from sensor 232. In some examples, sensor 232 may include a radiation sensor such as a radiation dosimeter comprising a metal oxide semiconductor field effect transistor (MOSFET). Sensor 232 may output a signal indicating an amount of radiation received. In some examples, sensor 232 may output a signal indicating a cumulative amount of radiation received over a time period. In other examples sensing circuit 234 and/or processing circuit 222 may receive the signal from sensor 232 and determine a cumulative amount of radiation received over a time period.

Circuit component 228 may be a non-radiation hardened component, similar to circuit component 128 described above in relation to FIG. 1. However, the example of circuit 60 may not include a representative circuit component held under bias, as depicted by circuit 120 in FIG. 1. Instead, during a design phase or construction phase of system 50, a statistically significant sample of components of the same type as circuit component 228 may be exposed to radiation, such as may be found in radiation exposure 15. The performance of the sample of components, such as frequency response, amplification gain, or other performance characteristics, may be measured before and after exposure to radiation. In this manner, any change in the performance of the components in the sample that result from radiation exposure may be determined.

In some examples, the sample of components may be subjected to a series of radiation exposures and the component performance measured before and after each exposure. In this manner, which may be referred to as testing and modeling or calibration, a component's performance may be characterized as a result of the exposure to radiation. The results of the performance characterization may be recorded in a look-up table, or a formula, such as a parametric relationship between radiation exposure and a particular performance characteristic. A parametric relationship, for example, may be a linear, piecewise linear, non-linear, or some other relationship. As a result of the calibration process, the performance characteristic for a type of component may be predicted based on the amount of radiation received by the component. Effects for compensation of bias and scale factor may be provided. For example, a component including an amplifier may decrease the amplifier gain by a percentage as the cumulative amount of radiation increases, e.g. 1% decrease for 100 millirads, 2% decrease for 200 millirads and 3% for 300 millirads. In another example, a component including a filter may shift the 3 dB cut-off point as radiation exposure increases.

In some examples, the statistically significant sample of components may be drawn from components that are as similar as possible to circuit component 228. For example, each manufacturing lot number of a particular type of component may be characterized separately. Similarly, a particular range of serial numbers of components may be characterized, and the component to be used in normal operation, circuit component 228, may be within the range of serial numbers, or lot number, of the tested sample. In this manner, the performance data for circuit component 228 may be more accurate than just selecting a sample from a manufacturer's part number, without taking into account manufacturing and handling variances.

Performance data 266 for circuit component 228 may be stored at memory 224 and accessible by processing circuit 222. As noted above, processing circuit 222 has similar function and description as processing circuit 122 depicted in FIG. 1. Likewise, memory 224 has a similar description to memory 124 described above. Performance data may be a look-up table, parametric relationship or other information that may be used to predict the performance characteristics of circuit component 228 based on an amount of radiation that circuit component 228 has been exposed to over a period of time. In other words, performance data 266 may store a mapping of amounts of radiation to compensation factors. Determining the compensation factor includes retrieving, by processing circuit 222, the compensation factor from the data storage unit based on the stored mapping.

During normal operation, a processing circuit 222 may be configured to determine an amount of radiation received over a time period, based on the signal from a radiation sensor, such as sensor 232. Normal operation for a spacecraft may include operating in orbit, transiting between locations, and sending and receiving communication. Circuits in normal operation in medical settings, power plant environments and other similar circuits, may perform their functions as designed.

Processing circuit 222 may determine a compensation factor for circuit component 228, based on the amount of radiation detected by sensing circuit 234 and the performance data 266 retrieved from memory 224. Processing circuit 222 may compensate circuit component 228 based on the amount of radiation received and the known component performance change caused by radiation retrieved from performance data 266, as determined during the modeling or calibration phase. As described above in relation to FIG. 1, in the example of FIG. 2, processing circuit 222 may output a signal 266 with the compensation factor. Junction 237 combines output signal 266 with signal 266. The compensation factor may correct desired output signal 240 for any performance change within circuit component 228 caused by radiation. Combining signals at a junction, such as junction 237 is one example of how circuit 60 may adjust output signal 266 to compensate the signal. In other examples, circuit 60 may adjust the gain of a feedback element in a closed loop around circuit component 228, or some other technique.

In other examples, compensation may not require processing circuit 222. For example, compensation may involve analog switches that are enabled based on radiation thresholds, which incorporate addition of scaling resistors to modify the correctional summing voltages. In other words, compensation factors us use lookup tables, algorithms such as response characterizations that build a polynomial curve fit, Kalman filter techniques, or other means of adaptive software.

Figure 3:
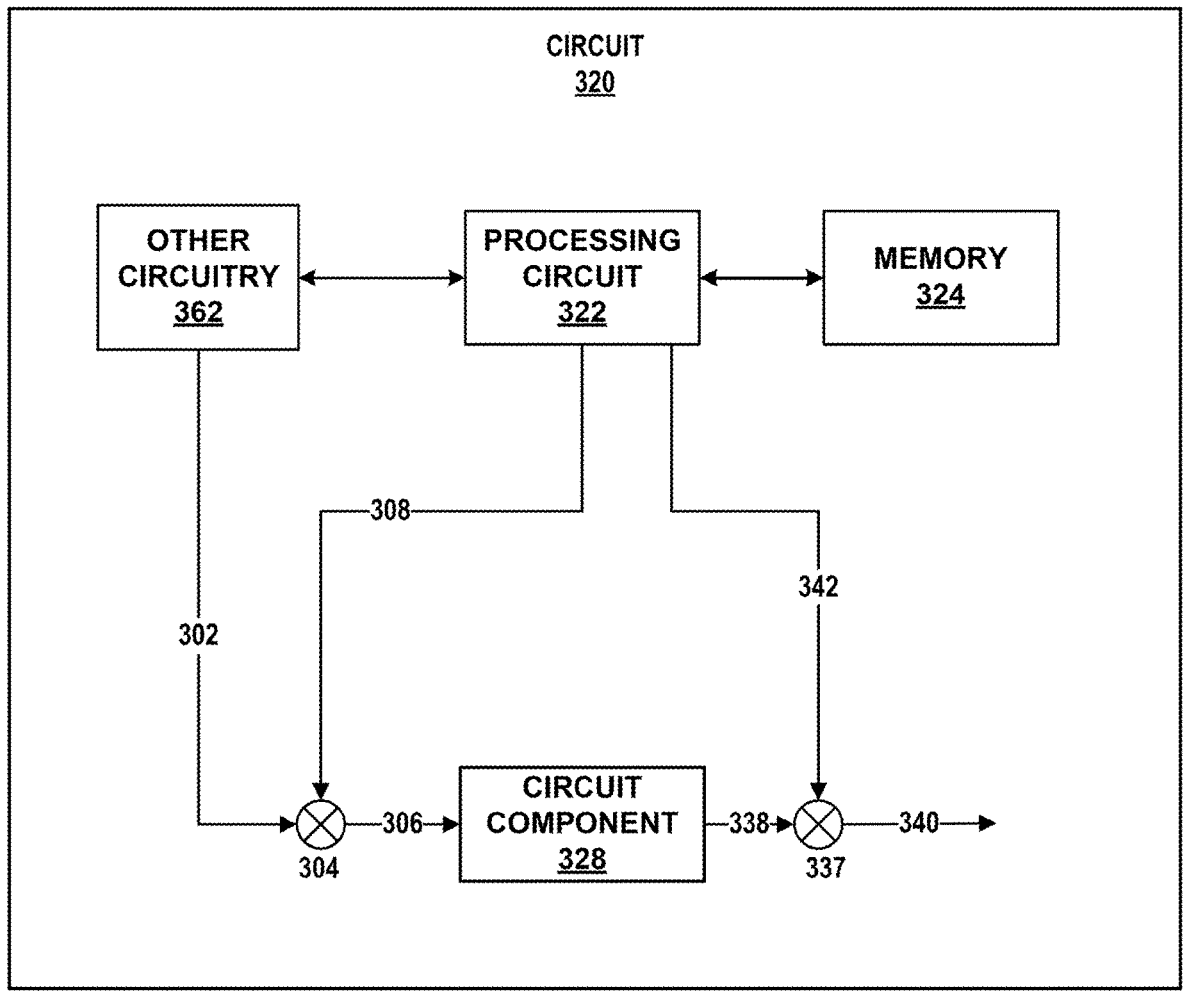
FIG. 3 is a block diagram illustrating an example circuit that may compensate the input of a circuit component to achieve a desired output signal.

FIG. 3 is a block diagram illustrating an example circuit that may compensate the input of a circuit component to achieve a desired output signal. The techniques illustrated by the example of circuit 100 may be applied to either system 100 or system 50 described above in relation to FIGS. 1 and 2.

Processing circuit 322 may determine a compensation factor by any of the techniques of this disclosure, such as retrieving performance data from memory 324. In the example of FIG. 3, circuit component 328 receives an input signal from other circuitry 362. Processing circuit 322 may output a signal 308 that includes the compensation factor. Junction 304 combines the compensation factor in signal 308 with the output signal 302 from other circuitry 362 and outputs a modified input signal 306 to circuit component 328. As described above, junction 304 may combine signals by either by scaling, offset or some combination.

Compensating the input 306 to circuit component 328 may correct desired output signal 340 for any performance change within circuit component 328 caused by radiation. Some examples of compensating the input signals may include adjusting the input voltage, input current, frequency content or features of the input 306 to circuit component 328. In other examples, processing circuit 322 may also compensate the output signal 338 from circuit component 328 via output signal 342 at junction 337, as described above.

Figure 4:
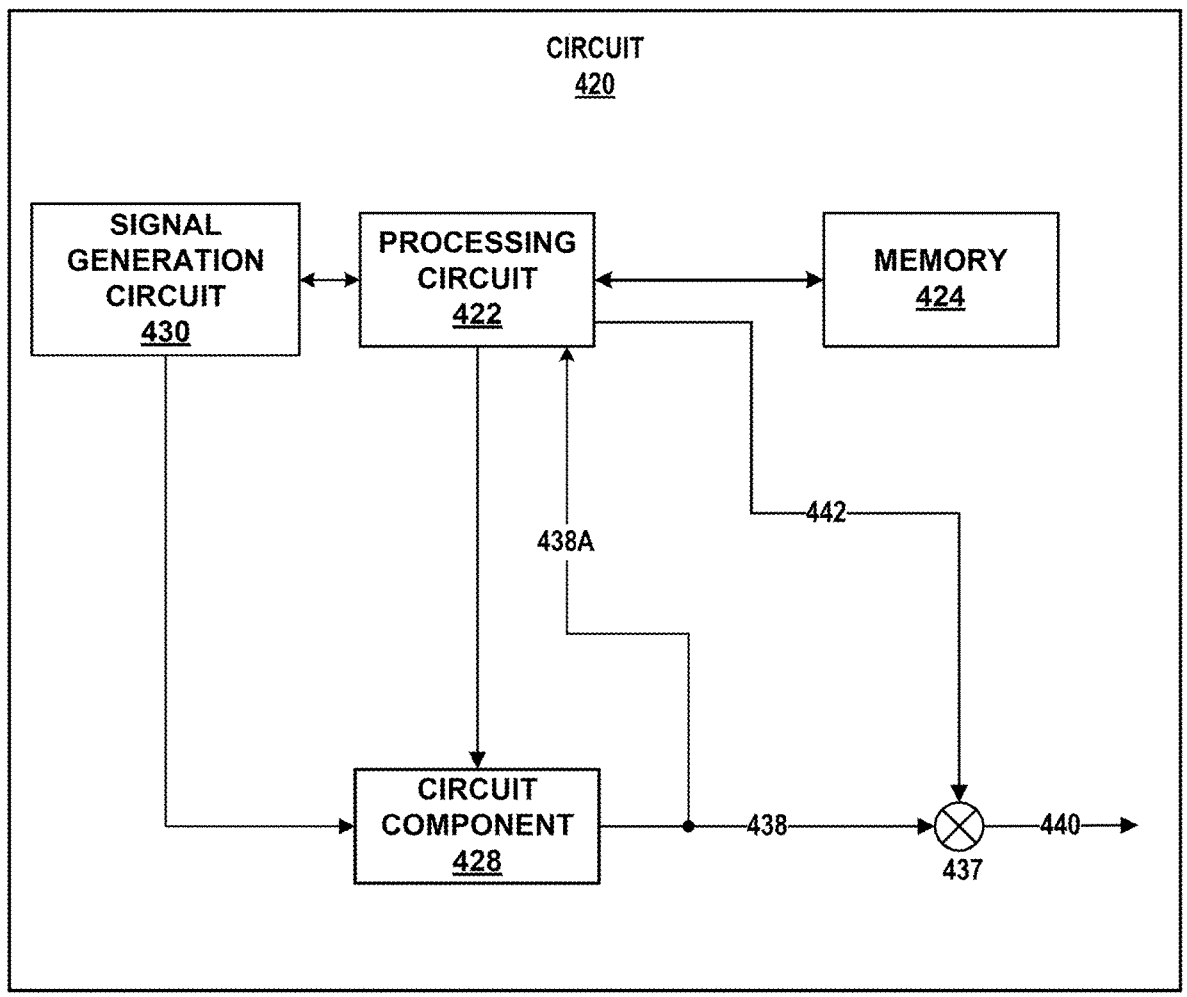
FIG. 4 is a block diagram illustrating an example circuit that may compensate the signal from a non-radiation hardened circuit component to correct for performance changes from radiation, according to one or more techniques of this disclosure.

FIG. 4 is a block diagram illustrating an example circuit that may compensate the signal from a non-radiation hardened circuit component to correct for performance changes from radiation, according to one or more techniques of this disclosure. Circuit 420 includes another example configuration of a subset of components also included in other figures within this disclosure. Circuit 420 includes processing circuit 422, which is coupled to memory 424 and may receive signals from, and send commands to, signal generation circuit 130 and may output a signal 442 to compensate the output signal 438 of circuit component 428, as described above in relation to FIGS. 1-3.

In the example of FIG. 4, processing circuit 422 may also monitor the output signal 438A of circuit component 428. In some examples, processing circuit 422 may monitor output signal 438A via a monitoring circuit that includes an analog switch, such as monitoring circuit 136 depicted in FIG. 1 (not shown in FIG. 4). As described above in relation to FIG. 2, processing circuit 422 may receive signals indicating the amount of radiation received by circuit 420 and circuit component 428 via a radiation sensor, such as sensor 32 (not shown in FIG. 4). Processing circuit 422 may further determine a compensation factor based on both the amount of radiation received as well as analysis of output signal 438A.

Said another way, processing circuit 422 may receive the output signal 438A of circuit component 428. In some examples, processing circuit 422 may compare output signal 438A to an expected signal and determine an error signal, where the error signal may be a difference between the output of the circuit component and the expected signal. In other examples, processing circuit 422 may perform other analysis on output signal 438A, and determine a compensation factor based on both the error signal and the amount of radiation received. In other examples, processing circuit 422, may determine the compensation factor based on the radiation received, and further compensate output signal 438 via signal 442 based on the error signal.

In other words, rather than relying completely on the predicted model of the impact on the performance characteristics of circuit component 428 from radiation, processing circuit 422 may also monitor the output signal 438A to determine the actual impact on performance. The technique of monitoring the output signal 438A and adjusting any compensation factor may also be applied to the techniques described in relation to FIG. 1, where the compensation factor is based on the output of a biased component. Monitoring output signal 438A and adjusting the compensation factor as needed may have the advantage of more accurate compensation for desired output signal 440, but may also add additional complication to circuit 420.

In other examples, rather than including a second component of the same type as circuit component 428 as a biased component, such as biased component 26, described above in relation to FIG. 1, the biased component and the operational component may be the same physical component. In one example, circuit component 428 may operate in a biased mode at a first time and in an operational mode at a second time. In other words, circuit component 428 may be configured to receive a bias signal from signal generation circuit 130 when configured to operate in the biased mode at the first time. Circuit component 428 may output a signal, similar to output signal 144 from biased component 126, as described above in relation to FIG. 1. Processing circuit may receive the output signal, i.e. output signal 438A, and based on output signal 438A while circuit component 428 is in the biased mode, determine a compensation factor for use in operational mode at a second time.

Processing circuit 422 may output signal 442, which includes the compensation factor, to junction 437 to adjust output signal 438 to achieve desired output signal 440, as described above in relation to FIGS. 1-3. Similarly, processing circuit 422 may compensate the input of circuit component 428, as described in relation to FIG. 3 above.

Figure 5:
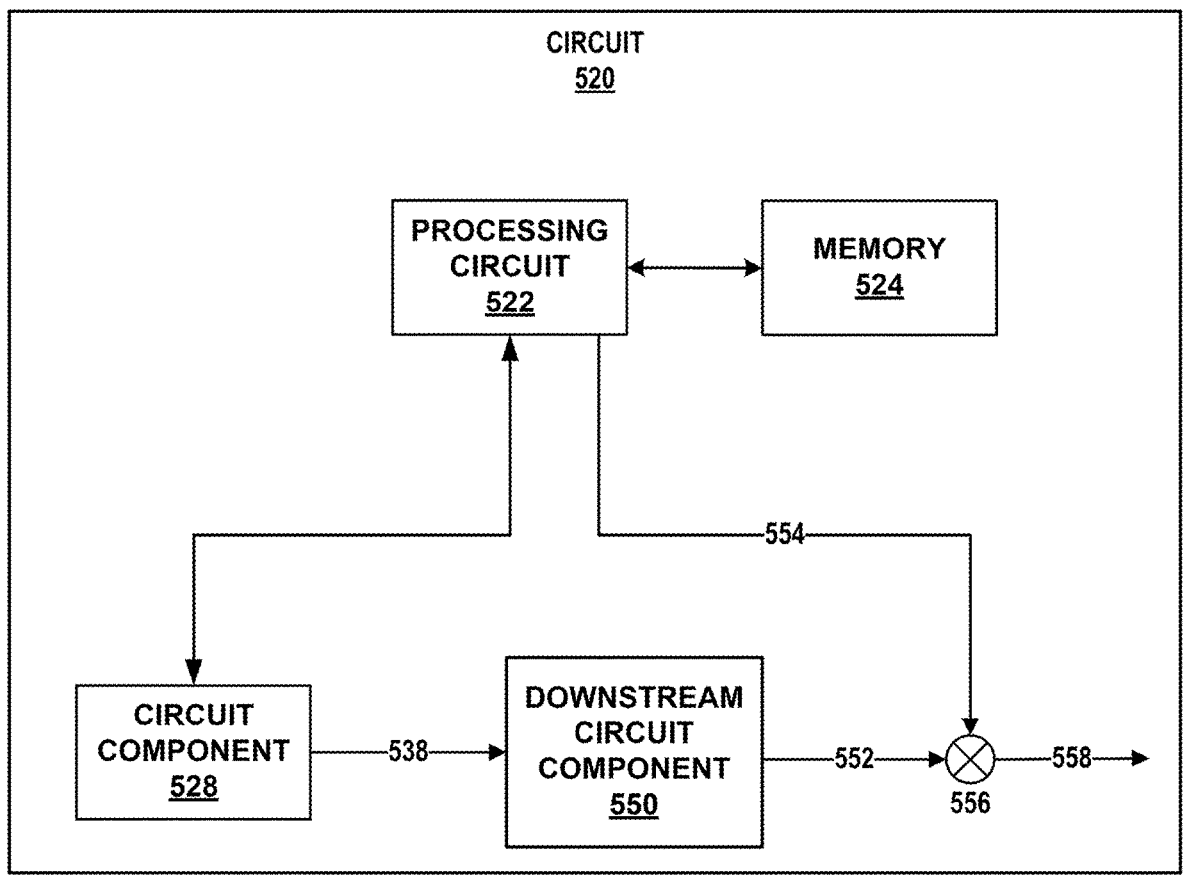
FIG. 5 is a block diagram illustrating an example circuit that may compensate a downstream component to correct for performance changes from radiation, according to one or more techniques of this disclosure.

FIG. 5 is a block diagram illustrating an example circuit that may compensate a downstream component to correct for performance changes from radiation, according to one or more techniques of this disclosure. Circuit 520 includes another example configuration of a subset of components, which may also be included in other figures within this disclosure. Circuit 520 includes processing circuit 522 coupled to memory 524, circuit component 528, downstream circuit component 550. As with FIGS. 1-4 above, components in FIG. 5 that have reference numerals with the same final two digits as reference numerals in FIG. 1, can be assumed to the same function as the reference numerals in FIG. 1 with the same final two digits. For example, components 122 and 522 may be assumed to have the same function, components 124 and 524 may be assumed to have the same function, and so on.

Downstream circuit component 550 may receive output signal 538 from circuit component 528. Downstream circuit component 550 may be any one or more components that are operatively coupled to circuit component 528, and receive and respond to output signal 538. In the example of FIG. 5, processing circuit 522 may determine a compensation factor by any technique described above in relation to FIGS. 1-4. Processing circuit 522 may output a signal 554 that includes the compensation factor to junction 556. Junction 556 may combine signal 554 with the output 552 of downstream circuit component 550, similar to described above in relation to junction 37. As with the examples above, the compensation factor, when applied to output signal 552, may correct output signal 552 to a desired signal that downstream circuit component 550 may have output before the performance changed for circuit component 528 based on radiation. In other words, processing circuit 522 may compensate output signal 538 of the first circuit component, circuit component 528, by adjusting an output of the second circuit component, downstream circuit component 550 to result in desired output signal 558.

In other examples, processing circuit 522 may compensate output 552 of downstream circuit component 550 by adjusting an input to the downstream circuit component 550 (not shown in FIG. 5), similar to the techniques described in relation to FIG. 3. Adjusting the input to a downstream circuit component may be desirable in examples in which the downstream circuit component is not directly connected to circuit component 528 and may have intervening components.

FIGS. 1-5 depict some examples of techniques to compensate the output of a component that may have been degraded or otherwise affected by radiation, such as by introducing a signal at a junction to scale or offset the output. In other examples, a processing circuit may compensate any intermediate input or output in the circuit. In other examples, a processor may not output a signal that includes a compensation factor, such as signal 142, but instead receive the uncompensated signal from the affected component and compensate the output using an algorithm in software.

Figure 6:
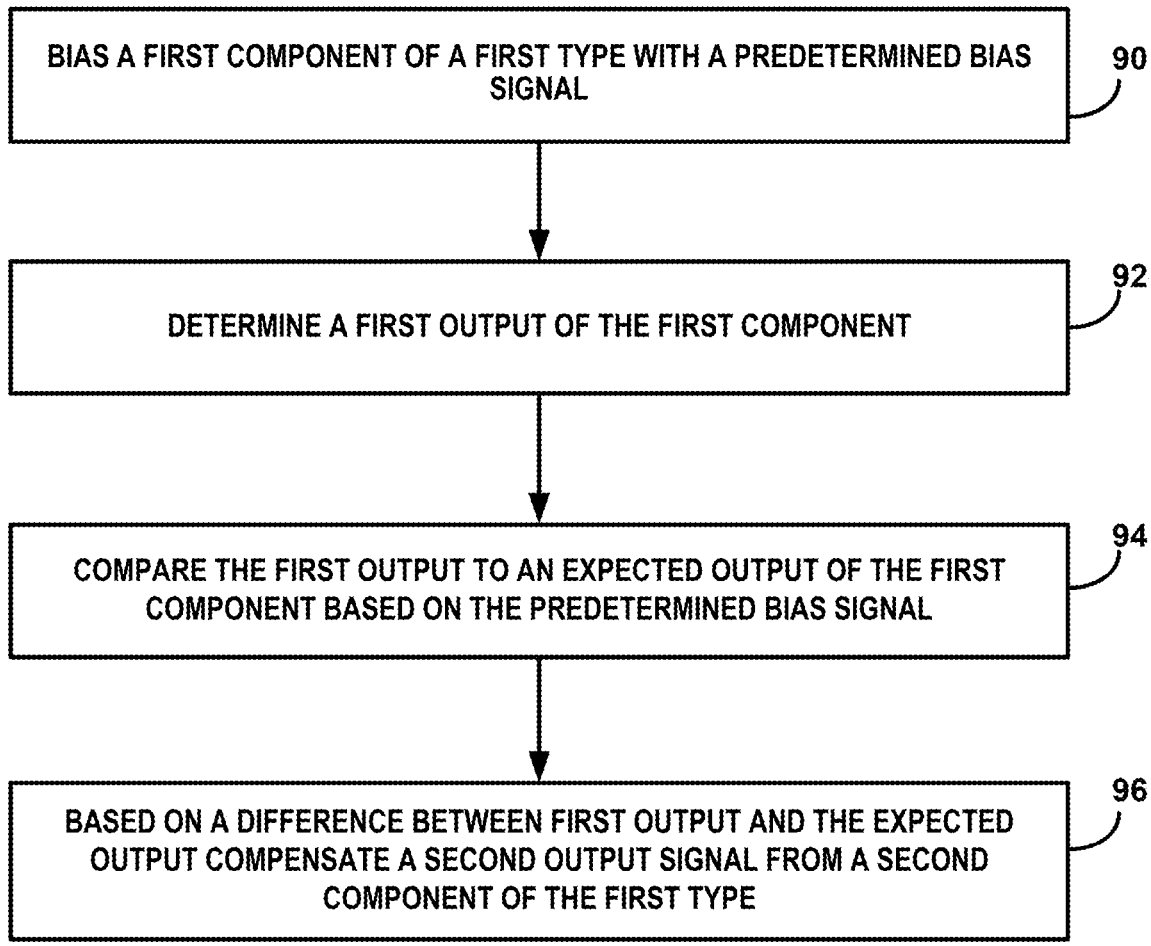
FIG. 6 is a flow chart illustrating an example mode of operation of a circuit configured to compensate one or more non-radiation hardened components for the effects of radiation, according to one or more techniques of this disclosure.

FIG. 6 is a flow chart illustrating an example mode of operation of a circuit configured to compensate one or more non-radiation hardened components for the effects of radiation, according to one or more techniques of this disclosure. The steps of FIG. 6 will be described in terms of FIG. 1, unless otherwise noted.

A system that may be subject to radiation exposure 15 may include both radiation hardened and non-radiation hardened components, as well as radiation shielding. In some examples, one or more performance characteristics of non-radiation hardened components may change when exposed to radiation. System 100 may include circuit 120, which is configured to compensate one or more non-radiation hardened components 28 based on an output signal from representative components of the same type. The representative components, e.g. biased component 126, may receive a predetermined bias signals, such as a DC voltage, or a time varying signal. In other words, circuit 120 may bias a first component of a first type, e.g. biased component 126, with a predetermined bias signal, such as the output from signal generation circuit 130 (90).

A portion of circuit 120, such as processing circuit 122, may determine a first output signal 144 from biased component 126 (92). In some examples, monitoring circuit 136 may receive output signal 144 and filter, amplify, sample or otherwise process output signal 144 and send the processed signal to processing circuit 122. As described above in relation to FIG. 1, biased component 126 is of the same type as circuit component 128 and may therefore be considered a representative component of circuit component 128.

Processing circuit 122 may determine whether there is a performance change in biased component 126, based on output signal 144. In one example, processing circuit 122 may compare the first output signal 144 to an expected output of the biased component 126 based on the predetermined bias signal from signal generation circuit 130 (94). For example, biased component 126 may receive a DC bias voltage and may output signal 144 that may be expected to be 2 V at 30 milliamps (mA). Processing circuit 122 may determine that there is a change in output signal 144, either an increase or decrease in voltage or current. In some examples, processing circuit 122 may determine that there is a change in output signal 144 by comparing output signal 144 to values retrieved from memory 124. In other examples, processing circuit 122 may compare output signal 144 to a reference signal generated by a radiation hardened component elsewhere in circuit 120 (not shown in FIG. 1).

As described above, processing circuit 122 may determine a compensation factor that may restore the desired signal output from biased component 126, i.e. return the output signal to 2V at 30 mA. This same compensation factor may be applied to circuit component 128 assuming that because biased component 126 and circuit component 128 are of the same type and have been exposed to the same radiation, the performance change may be the same for each.

Based on a difference between first output signal 144 and the expected output signal, processing circuit 122 may compensate a second output signal 138 from circuit component 128, which is of the same type as biased component 126 (96). As described above in FIGS. 1-5, processing circuit 122 may apply the compensation factor to restore the desired signal output from circuit component 128 in a variety of ways.

Figure 7:
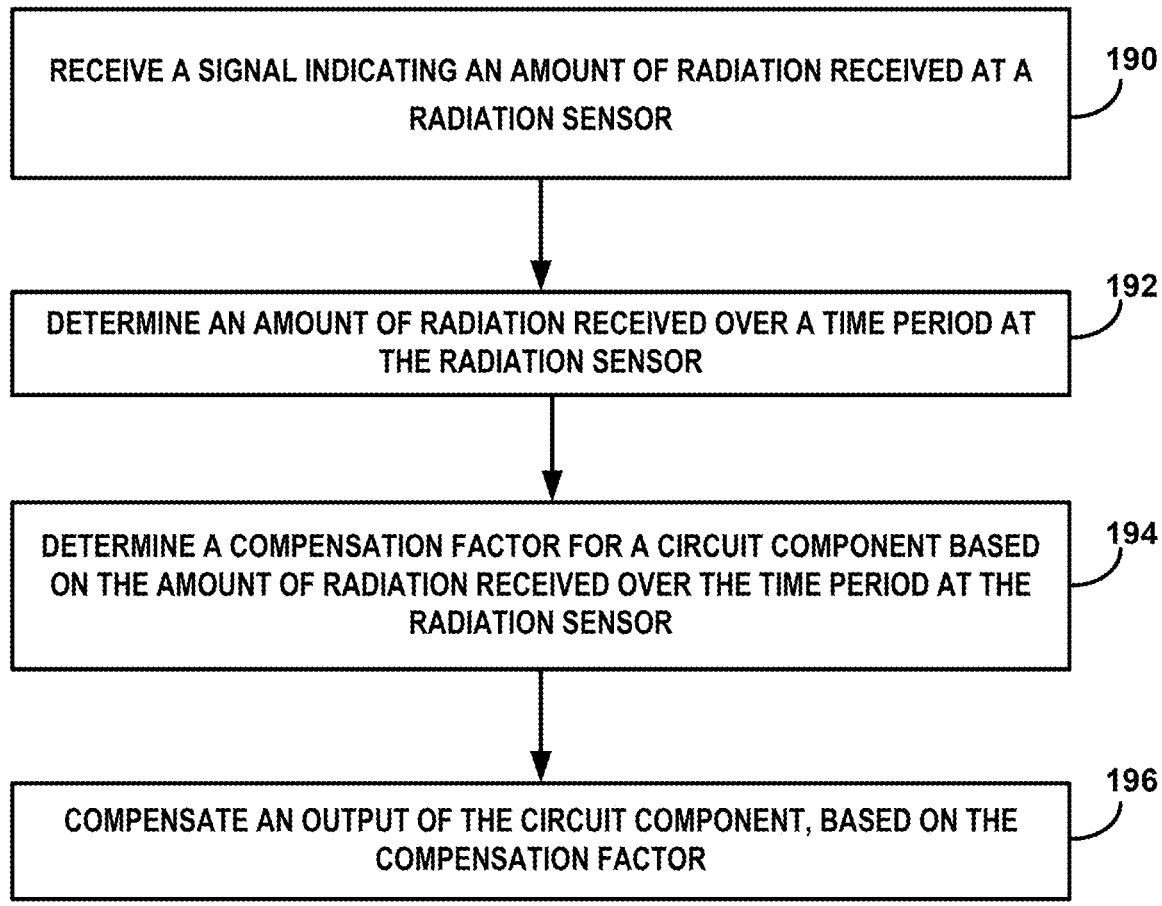
FIG. 7 is a flow chart illustrating an example mode of operation of a circuit configured to compensate one or more non-radiation hardened components based on calibration data of the effects of radiation, according to one or more techniques of this disclosure.

FIG. 7 is a flow chart illustrating an example mode of operation of a circuit configured to compensate one or more non-radiation hardened components based on calibration data of the effects of radiation, according to one or more techniques of this disclosure. The steps of FIG. 7 will be described in terms of FIG. 2, unless otherwise noted.

As described above in relation to FIG. 2, performance data 266 may be stored in memory 224. Performance data 266 may include changes in one or more performance characteristics of circuit component 228, based on characterization of components similar to circuit component 228. Similar components may include components of the same type from the same manufacturing lot number. Performance data 266 may include look-up tables, parametric relationships and similar calibration data that characterize the impact on one or more performance characteristics based on an amount of radiation exposure 15.

In the example of FIG. 7, processing circuit 222 of circuit 220 may receive a signal indicating an amount of radiation received at a radiation sensor, such as sensor 232 (190). In some examples, the signal from sensor 232 may be filtered, amplified and/or sampled by sensing circuit 234 before sending to processing circuit 222.

During normal operation, processing circuit 222 may determine an amount of radiation received by circuit 220 over a time period at the radiation sensor (192). In some examples, processing circuit 222 may receive the signal from sensor 232 and determine a cumulative amount of radiation received by circuit 220 over a time period.

Processing circuit 222 may determine a compensation factor for a circuit component based on the amount of radiation received over the time period at the radiation sensor and the performance data 266 stored at memory 224 (194). In the example of FIG. 7, processing circuit 222 determines the compensation factor during normal operation. The compensation factor may be configured to restore the desired output signal 240 from circuit component 228 after a known component performance change caused by radiation as determined during calibration testing on similar components.

Processing circuit 222 may compensate an output signal 238 of circuit component 228, based on the compensation factor processing circuit 222 may apply the compensation factor to restore the desired signal output from circuit component 228 in a variety of ways, as described above in relation to FIGS. 1-5. On example includes combining a signal 242 with output signal 238 at junction 237.

In one or more examples, the functions described above may be implemented in hardware, software, firmware, or any combination thereof. For example, the various components of FIG. 3, such as receiver electronics 315 and controller and signal generator 320 may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media, such as memory 24, can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more DSPs, general purpose microprocessors, ASICs, FPGAs, or other equivalent integrated or discrete logic circuitry. Accordingly, the term "processor," as used herein, such as processing circuit 22, may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples of the disclosure have been described. These and other examples are within the scope of the following claims.

The invention claimed is:

1. A method comprising:
receiving, by a processing circuit, a signal indicating an amount of radiation received at a radiation sensor;
determining, by the processing circuit, an amount of radiation received over a time period at the radiation sensor;
monitoring, by the processing circuit, the output of a circuit component;
determining, by the processing circuit, a compensation factor for the circuit component based on the amount of radiation received over the time period at the radiation sensor, wherein the compensation factor is based on both a predicted change in performance for the circuit component based on the amount of radiation and the monitored output; and
correcting, by the processing circuit, an output signal of the circuit component for a performance change of the circuit component over the time period, based on the compensation factor.

2. The method of claim 1, wherein the compensation factor comprises at least one of a scaling factor or an offset factor.

3. The method of claim 1, wherein the compensation factor is based on a predicted change in performance for the circuit component based on the amount of radiation.

4. The method of claim 1, wherein the amount of radiation is a cumulative amount of radiation received over the time period.

5. The method of claim 1, wherein correcting the output signal comprises adjusting an input to the circuit component.

6. The method of claim 1, further comprising:
storing, in a data storage unit, a mapping of amounts of radiation to compensation factors, and wherein determining the compensation factor comprises retrieving, by the processing circuit, the compensation factor from the data storage unit based on the stored mapping.

7. The method of claim 1, wherein the circuit component is a first circuit component operatively coupled to a second circuit component, wherein correcting the output signal of the first circuit component comprises adjusting an output of the second circuit component.

8. The method of claim 1, wherein the radiation sensor comprises a radiation dosimeter comprising a metal oxide semiconductor field effect transistor (MOSFET).

9. A circuit comprising:
a processing circuit;
a radiation sensor, wherein the processing circuit is configured to receive a signal indicating an amount of radiation received over a time period at the radiation sensor;
a circuit component;
wherein the processing circuit is configured to:
monitor the output of the circuit component;
determine an amount of radiation received over a time period, based on the signal from the radiation sensor;
determine a compensation factor for the circuit component,
based on the amount of radiation received over the time period at the radiation sensor; and
based on both a predicted change in performance for the circuit component based on the amount of radiation and the monitored output; and
correct the output of the circuit component for a performance change of the circuit component over the time period, based on the compensation factor.

10. The circuit of claim 9, wherein the processing circuit is configured to correct the output by making an adjustment to an input to the circuit component.

11. The circuit of claim 9, wherein the compensation factor comprises at least one of a scaling factor or an offset factor.

12. The circuit of claim 9, wherein the compensation factor is based on a predicted change in performance for the circuit component based on the amount of radiation.

13. The circuit of claim 9, further comprising a data storage unit, wherein the processing circuit is configured to determine the compensation factor by retrieving the compensation factor from a data storage unit.

14. The circuit of claim 13, wherein the processing circuit is configured to retrieve the compensation factor from the data storage unit based on a stored mapping in a data storage unit of amounts of radiation to compensation factors.

15. The circuit of claim 9, wherein the circuit component is a first circuit component operatively coupled to a second circuit component, wherein the processing circuit is configured to correct the output of the first component by at least making an adjustment to an input of the second circuit component.

16. The circuit of claim 9, wherein the circuit component is a first circuit component operatively coupled to a second circuit component, wherein the processing circuit is configured to correct the output of the first circuit component by at least making an adjustment to an output of the second circuit component.

17. The circuit of claim 9, further comprising a digital-to-analog (D/A) circuit, wherein correcting the output of the circuit component comprises combining the output of the circuit component with an output of the D/A circuit.

18. The circuit of claim 9, wherein the amount of radiation is a cumulative amount of radiation received over the time period.

19. The circuit of claim 9, wherein the radiation sensor is a radiation dosimeter comprising a metal oxide semiconductor field effect transistor (MOSFET).

20. The circuit of claim 9, wherein the processing circuit is configured to correct an output of the circuit component during normal operation.

* * * * *